United States Patent [19]
Lee et al.

[11] Patent Number: 5,504,715
[45] Date of Patent: Apr. 2, 1996

[54] WORD LINE LOADING COMPENSATING CIRCUIT OF SEMICONDUCTOR MEMORY DEVICE

[75] Inventors: Yeong-Taek Lee; Jong-Hyun Choi, both of Seoul, Rep. of Korea

[73] Assignee: Samsung Electronics Co., Ltd., Suwon, Rep. of Korea

[21] Appl. No.: 343,949

[22] Filed: Nov. 17, 1994

[30] Foreign Application Priority Data

Nov. 17, 1993 [KR] Rep. of Korea ............... 24487/1993

[51] Int. Cl.⁶ .................................................. G11C 8/00
[52] U.S. Cl. ........................ 365/230.06; 365/189.11; 365/194; 365/204
[58] Field of Search .................. 365/230.06, 194, 365/189.11, 204

[56] References Cited

U.S. PATENT DOCUMENTS

| | | | |
|---|---|---|---|
| 4,896,297 | 1/1990 | Miyatake et al. | 365/189.11 |
| 4,967,399 | 10/1990 | Kuwabara et al. | 365/230.06 |
| 5,010,259 | 4/1991 | Inoue et al. | 365/189.11 |
| 5,185,721 | 2/1993 | Love et al. | 365/189.11 X |
| 5,404,330 | 4/1995 | Lee et al. | 365/189.11 |

*Primary Examiner*—David C. Nelms
*Assistant Examiner*—Son Dinh
*Attorney, Agent, or Firm*—Cushman Darby & Cushman

[57] ABSTRACT

A word line loading compensating circuit compensates a word line boosted voltage level changed in accordance with a word line loading. A word line boosting circuit outputs a word line boosted voltage boosted over a power supply voltage input from the exterior of a chip, so as to boost a voltage of the word line connected to the memory cell array. A row decoder is connected to the word line boosted voltage output from the word line boosting circuit and selects a memory cell from an array of memory cells in correspondence with a predetermined row address signal. A capacitor connected between the word line boosted voltage and the row decoder stores a charge from the word line boosted voltage. A variable connecting device connects the word line boosted voltage to the capacitor before the word line boosted voltage reaches a saturation level, and cuts off the word line boosted voltage from the capacitor after the word line boosted voltage reaches the saturation level. A delay device inputs the word line boosted voltage, delays the input word line boosted voltage during the arrival time of the saturation level, and generates a delay output signal which controls the variable connecting device. A discharging device is controlled by the delay output signal and discharges the charge stored in the capacitor to ground after the word line boosted voltage reaches the saturation level.

15 Claims, 2 Drawing Sheets

WORD LINE LOADING COMPENSATING CIRCUIT OF SEMICONDUCTOR MEMORY DEVICE

FIELD OF THE INVENTION

The present invention relates to a semiconductor memory device and more particularly to a word line loading compensating circuit which is provided for compensating a word line boosted voltage level changed in accordance with a word line loading.

BACKGROUND OF THE INVENTION

Generally, in a semiconductor memory device such as a dynamic random access memory device, a memory cell is comprised of one access transistor and one storage capacitor. The storage capacitor stores data having a value "1" or "0" therein, which data is transmitted to a bit line through the channel of the access transistor. At that time, the transmission speed of data to the bit line and a voltage level state thereof are defined in dependance upon a voltage level of the word line applied to the gate of the access transistor.

In the meanwhile, the higher the density of a semiconductor memory device, the smaller the size of the transistors, so that an operating power supply voltage is on a descending trend. In case of the high density semiconductor memory device using a low power supply voltage, the voltage level of the word line applied to the gate of the access transistor provided in the memory cell is not high enough to transmit the data stored in the storage capacitor to the bit line, thus reducing an operating speed of the device. In order to solve such a problem, the high density semiconductor memory device includes a word line boosting circuit which serves to raise the voltage level of the word line applied to the gate of the access transistor. The technique on the word line boosting circuit is disclosed in detail in U.S. Pat No. 5,404,330, issued Apr. 4, 1995.

FIG. 1 is a block diagram illustrating a conventional word line boosting method. Referring to FIG. 1, there are provided a word line boosting circuit 5, a row decoder 10 controlled by a row address signal, and a memory cell array block 15 connected to word lines WL0 . . . WLn which are selected by the row decoder 10. As shown in the figure, in a conventional technique, the word line boosting circuit 5 is provided for raising a word line voltage up to a higher voltage than a power supply voltage Vcc, using a charge pumping manner without using a separate power supply voltage Vcc. A word line boosted voltage level is determined in dependence upon a charge sharing ratio between a pumping capacitor (not shown) and a parasitic capacitance of a word line to be enabled. Thereafter, the larger the pumping capacitor as compared with that of the word line parasitic capacitance, the higher the level of the boosted voltage. Hence, the size of the pumping capacitor of the word line boosting circuit 5 causes, with consideration of the loading of the word line, the word line voltage level to be over Vcc+Vtn (where Vtn is a threshold voltage of the access transistor in a memory cell), upon the enablement of the word line. If the size of the pumping capacitor is excessively larger than the loading of the word line, the word line voltage will become too high and the reliability and lifetime of the chip is lessened due to an excessive stress voltage applied thereto. On the other hand, if the size of the pumping capacitor is excessively smaller than the parasitic loading of the word line, a voltage of the bit line is not sufficiently transmitted to the storage capacitor in the memory cell.

FIG. 2 is a block diagram illustrating another conventional word line boosting method of a high density semiconductor memory device. In the figure, two memory cell array blocks 35 and 40 connected to a single word line boosting circuit 5 are selected by row decoders 25 and 30 respectively controlled by the row address signals. FIG. 2 shows that different coding methods of the different row decoders 25 and 30 select the word line upon circuit operation. Upon an active operation, in one of the memory cell array blocks 35 and 40, a constant number of word lines is enabled by the operation of the row decoders 25 and 30, thereby allowing the addressed memory cell array block 35, 40 to be connected to the word line boosting circuit 5. In the other memory cell array block, 35, 40, a constant number of word lines is enabled by the respective row address signal, or no word line enable operation is performed. Accordingly, the word line parasitic loading connected to the word line boosting circuit 5 is changed in accordance with the enablement of one memory cell array block or two memory cell array blocks.

If the word line boosting circuit 5 is designed in consideration of the case where the word line is loaded by two enabled memory cell array blocks 25 and 30, then when only one memory cell array block is enabled, the word line voltage goes to too high and the lifetime and reliability of the memory device are reduced due to an excessive stress voltage applied thereto. On the other hand, if the word line boosting circuit 5 is designed in consideration of the case where, the word line is loaded by enablement of either one of the two memory cell array blocks 25 and 30 then, when the two memory cell array blocks 25 and 30 are enabled, the word line voltage falls to too low a level because the loading of the word line is too much larger than the size of the pumping capacitor of the word line boosting circuit 5.

In one operation cycle of dynamic random access memory as shown in FIGS. 1 and 2, it is apparent to one skilled in the art that the number of enabled word lines is determined by a refresh cycle. In the case of the dynamic random access memory having the same number of word lines, if the number of the refresh cycles is increased, the number of enabled word lines is reduced. If the refresh cycle in one chip is designed to be changed by a specific refresh cycle control signal, the word line loading connected to the word line boosting circuit will be changed in accordance with the refresh cycle control signal. In general, since it is difficult to change the size of the pumping capacitor size stored in the word line boosting circuit, a word line loading compensating circuit should be provided therein.

Typically, in a dynamic random access memory adopting a self refresh, in the case of entering into a self refresh timing, the refresh cycle has to be shortened to the minimum, and the word line loading to be activated within the same refresh time has to be reduced to the minimum, thereby reducing an average operation current consumption. Hence, when the number of the refresh operation cycles is smaller than the number of normal operation cycles, it is necessarily essential that the word line loading compensating circuit be provided.

FIG. 3 is a circuit diagram illustrating a conventional word line loading compensating circuit which compensates for word line loading. That is, this word line loading compensating circuit prevents the word line boosted level from being changed when the word line loading is altered. The circuit includes a pass transistor 45 for receiving a predetermined enable signal φEN, a pull-down transistor 50 whose gate is connected to the channel of the pass transistor 45 and whose one terminal is connected to the output terminal of the word line boosting circuit 5, and a capacitor 55 connected between the other terminal of the pull-down transistor 50 and a ground voltage for storing a moved charge from the output signal of the word line boosting circuit 5. The gate of the pass transistor 45 is connected to a power supply voltage Vcc.

An explanation of the operation of the word line loading compensating circuit of FIG. 3 will be given hereinafter. If the number of word lines connected to the word line boosting circuit 5 is decreased to reduce the word line loading, the enable signal φEN is enabled to a logic "high" state and input to the pass transistor 45. Thereby, the pull-down transistor 50 is turned on and the moved charge from the output signal of the word line boosting circuit 5 is transferred to the capacitor 55. That is, as is seen from the operation mentioned above, if the word line loading is reduced, the pass transistor 45 provides loading to compensate the reduction of the word line loading. In other words, the pass transistor 45 allows the boosted level of the gate of the pull-down transistor 50 being self-boosted, when the word line voltage is boosted, to be fully transferred to the capacitor 55.

However, in the operation of the word line loading compensating circuit, since the boosted voltage level is directly applied to the gate of the pull-down transistor 50, the boosted voltage level is always applied to both ends of the gate oxide layer thereof of the capacitor 55. As discussed above, the word line boosted voltage level is maintained to be over Vcc+Vtn, considering the threshold voltage Vtn of the access transistor in the memory cell. Hence, an excessive electric field is formed in the gate oxide layer of the capacitor 55 as compared to other capacitors, so that there are problems in that the gate oxide layer is destroyed or caused to be in a bad condition. In the case of the dynamic random access memory device, since the output of the word line boosting circuit is kept at the boosted level during the active cycle, the gate oxide layer of the capacitor receives a voltage causing a continuous stress. Therefore, if the duration of time of the active cycle is lengthened, the application time of the stress voltage to the gate oxide layer of the capacitor is more extended. As a result, an insulation characteristic of the gate oxide layer is broken down due to the application of the stress voltage, and there are problems in that a leakage path is formed in capacitor 55 and the current thereof is leaked to ground. Accordingly, the word line voltage level is lower due to the leaking current and thus the dynamic random access memory device can not perform an accurate operation.

SUMMARY OF THE INVENTION

An object of the present invention is to provide a word line loading compensating circuit which can improve the reliability of a semiconductor integrated circuit.

Another object of the present invention is to provide a word line loading compensating circuit which prevents generation of a leaking current, thereby supplying a constant word line voltage.

Still another object of the present invention is to provide a word line loading compensating circuit which prevents malfunctions caused by an excessive stress voltage, thereby improving reliability of a semiconductor integrated circuit.

According to an aspect of the present invention, there is provided a semiconductor integrated circuit including a memory cell array having a plurality of memory cells, a word line boosting circuit for outputting a word line voltage boosted over a power supply voltage input from the exterior of a chip, so as to boost a voltage of a word line connected to the memory cell array. A row decoder connected to the word line boosted voltage output from the word line boosting circuit selects the memory cell array in correspondence with a predetermined row address signal, and comprises a capacitor connected between the word line boosted voltage and the row decoder for storing a charge from the word line boosted voltage, a variable connecting device for connecting the word line boosted voltage to the capacitor, before the word line boosted voltage reaches a saturation level, and for cutting the word line boosted voltage from the capacitor, after the word line boosted voltage reaches the saturation level, a delay device for inputting the word line boosted voltage, delaying the inputted word line boosted voltage during an arrival time of the saturation level, and generating a delay output signal which controls the variable connecting device, and a discharging device controlled by the delay output signal output from the delay device for discharging the charge stored in the capacitor to ground, after the word line boosted voltage reaches the saturation level.

The variable connecting device includes a gating device for receiving the delay output signal output from the delay device and a predetermined enable signal, a pass transistor whose one terminal is connected to the output signal of the gating device and whose gate is connected to the power supply voltage, and a pull-down transistor whose gate is connected to the other terminal of the pass transistor, whose one terminal is connected to the word line boosted voltage, and whose other terminal is connected to the capacitor.

BRIEF DESCRIPTION OF DRAWINGS

A more complete appreciation of the invention, and many of the attendant advantages thereof, will be readily enjoyed as the same becomes better understood by reference to the following detailed description when considered in conjunction with the accompanying drawings in which like numbers indicate the same or similar components, wherein.

DETAILED DESCRIPTION OF THE PREFERRED EMBODIMENTS

Figure 4:
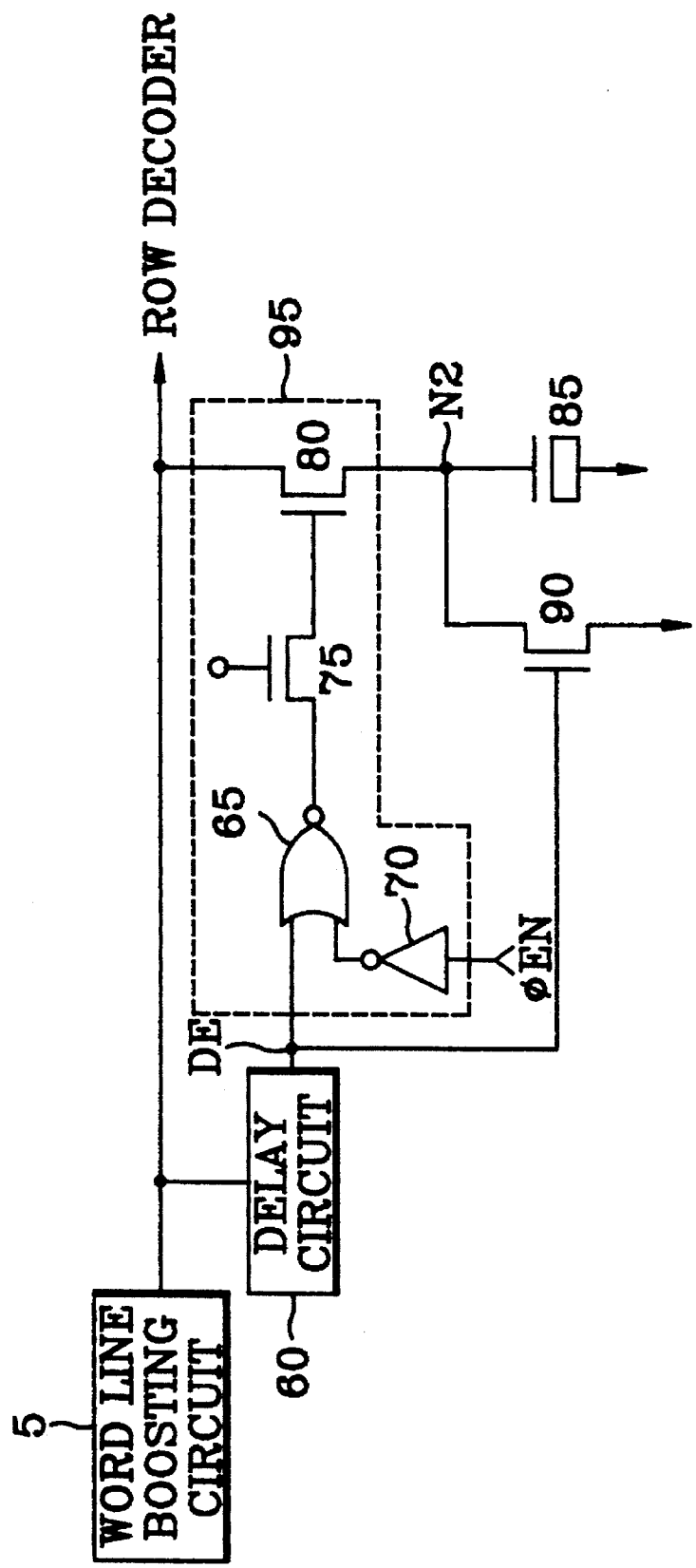
FIG. 4 is a circuit diagram illustrating a word line loading compensating circuit according to the present invention.

FIG. 4 is a circuit diagram illustrating a word line loading compensating circuit according to the present invention. Referring to FIG. 4, the word line loading compensating circuit includes a row decoder for selecting a memory cell array block having a plurality of memory cells, a word line boosting circuit 5 connected to the row decoder at the output terminal thereof for outputting a word line boosted voltage boosted over the power supply voltage supplied from the exterior of a chip. A delay circuit 60 delays the output signal of the word line boosting circuit 5 and outputs a delay output signal DE, and a discharging NMOS-type transistor 90 having a gate connected to the delay output signal DE of the delay circuit 60. In addition, the word line loading compensating circuit includes a NOR gate 65 having input the delay output signal DE of the delay circuit 60 and an enable signal φEN inverted by an inverter 70. A pass transistor 75 has one terminal to which the output signal of the NOR gate 65 is applied. A pull-down transistor 80 has a gate connected to the other terminal of the pass transistor 75, has one terminal connected to the word line boosting voltage, and another terminal connected to a capacitor 85. The capacitor 85 is connected between the other terminal of the pull-down transistor 80 and the ground voltage and stores a charge from the word line boosted voltage. The gate of the pass transistor 75 is connected to the power supply voltage Vcc. In the figure, a circuit 95 indicated by the dotted line functions as a variable connecting circuit which variably connects or does not connect the word line boosting circuit with the capacitor 85.

An explanation of the operation of FIG. 4 will be given in detail, hereinafter.

Typically, the duration of time that the output signal of the word line boosting circuit 5 reaches a saturation level requires about 10 nanoseconds to 20 nanoseconds. In the conventional word line loading circuit of FIG. 3, since a part of the charge of the word line boosted voltage output from the word line boosting circuit 5 and applied to the word line is moved into the capacitor 85 through the pull-down transistor 80, then serving to lower the word line boosting voltage level, if the voltage level at the node N1 is identical to the saturation level of the word line boosted voltage output from the word line boosting circuit 5, no additional charge is moved into the node N1. As a result, from this time point to the next active cycle, the operation of the word line loading compensating circuit is not necessary.

Figure 1:
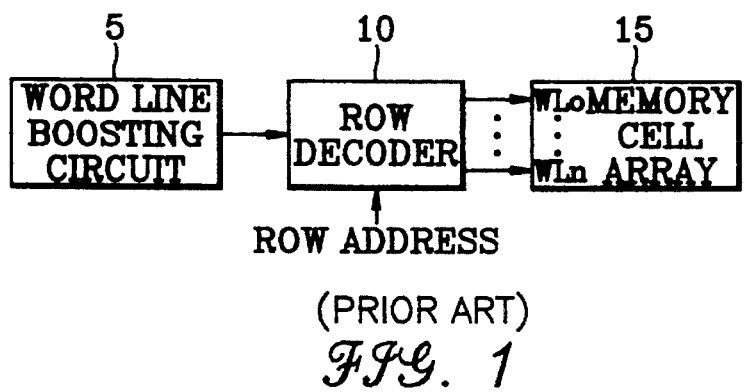
FIG. 1 is a block diagram illustrating a conventional word line boosting method.
Figure 2:
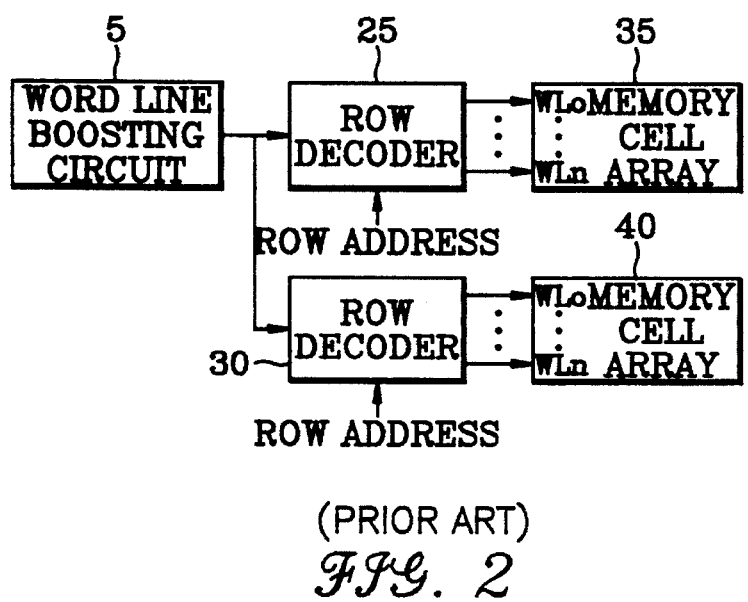
FIG. 2 is a block diagram illustrating another conventional word line boosting method.
Figure 3:
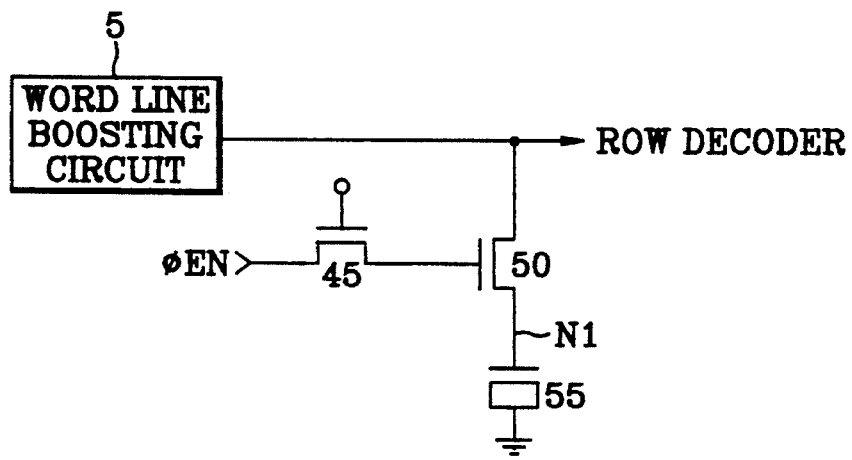
FIG. 3 is a circuit diagram illustrating a conventional word line loading compensating circuit.

Furthermore, in the conventional word line loading circuit of FIG. 3, since the voltage at the node N1 maintains the word line boosted voltage level until the completion of the active cycle, if the active cycle is lengthened, an insulation characteristic of the gate oxide layer of the capacitor 55 is broken down and a leaking current is formed accordingly. As a result, the word line voltage level is lower due to the leaking current and the semiconductor memory device can not perform an accurate operation.

To solve these problems mentioned above, there is provided the word line loading compensating circuit according to the present invention. In the circuit of FIG. 4, the variable connecting circuit 95 connects the word line boosted voltage with the capacitor 85 before the word line boosted voltage output from the word line boosting circuit 5 reaches the saturation level, and cuts off the word line boosted voltage from the capacitor 85 after the word line boosted voltage reaches the saturation level.

Before the word line boosted voltage output from the word line boosting circuit 5 reaches the saturation level, the word line boosting circuit 5 outputs the delay output signal DE through the delay circuit 60 at a logic "low" state. That is, when the enable signal φEN being at a logic "high" state is input and the delay output signal DE output from the delay circuit 60 is kept at the logic "low" state, the output signal of the NOR gate 65 goes to the logic "high" state, thereby turning the pull-down transistor 80 on. At this time, the NMOS transistor 90 is turned off. Accordingly, the pull-down transistor 80 moves the charge of the word line boosted voltage output from the word line boosting circuit 5 to the capacitor 85 for storage therein.

On the other hand, after the word line boosted voltage output from the word line boosting circuit 5 reaches the saturation level, the word line boosting circuit 5 outputs the delay output signal DE at a logic "high" state through the delay circuit 60. That is, when the enable signal φEN being at a logic "high" state is input, the output signal of the NOR gate 65 goes to the logic "low" state, thereby turning the pull-down transistor 80 off. At this time, the NMOS transistor 90 is turned on. Accordingly, the voltage at the node N2 is discharged to the ground voltage. At this time, the delay time by the delay circuit 60 is set to be identical to the time for the voltage at the node N2 to reach the saturation level of the word line boosted voltage.

Thereby, the voltage at the node N1 is kept at the word line boosted voltage level only during the operation of the word line loading compensating circuit, whereas the voltage at the node N1 is kept at the ground voltage level during the remaining active cycle except during the operation of the word line loading compensating circuit, so that the time duration applied to the gate oxide layer of the capacitor 85 can be reduced and the memory device can be stably operated. The construction of the delay circuit 60 may be conventionally implemented as an inverter chain and the number of inverters used can be varied considering the time that the output signal of the word line boosting circuit 5 reaches the saturation level.

As previously discussed, it is apparent to one skilled in the art that many widely different embodiments of the word line loading compensating circuit of the present invention may be constructed without departing from the spirit and scope of the present invention. In particular, in the variable connecting circuit 95 of the word line compensating circuit, the gate elements may be constructed in a variable manner.

As mentioned above, the word line loading compensating circuit according to the present invention can prevent the gate oxide layer of capacitor from being broken down by controlling the application time of the stress voltage to the gate of the capacitor. Further, the word line loading compensating circuit can always provide a constant word line voltage by ensuring that no leaking current flows to the capacitor.

What is claimed is:

1. A semiconductor integrated circuit comprising:

a memory cell array having a plurality of memory cells;

a word line boosting circuit for outputting a word line boosted voltage boosted over a power supply voltage so as to boost a voltage of a word line connected to said memory cell array;

a row decoder connected to said word line boosted voltage output from said word line boosting circuit for selecting said memory cell array in correspondence with a predetermined row address signal;

a capacitor for storing a charge from said word line boosted voltage;

variable connecting means for connecting said word line boosted voltage to said capacitor before said word line boosted voltage reaches a saturation level, and for cutting off said word line boosted voltage from said capacitor after said word line boosted voltage reaches said saturation level;

delay means, having said word line boosted voltage input thereto, for delaying said word line boosted voltage during an arrival time of said saturation level, and for generating a delay output signal which controls said variable connecting means; and discharging means, controlled by said delay output signal output from said delay means, for discharging said charge stored in said capacitor to ground after said word line boosted voltage reaches said saturation level.

2. The semiconductor memory device as claimed in claim 1, wherein:

said arrival time of said saturation level of said word line boosted voltage is approximately 10 nanoseconds to 20 nanoseconds.

3. The semiconductor memory device as claimed in claim 1, wherein said variable connecting means comprises:

gating means for receiving said delay output signal output from said delay means and a predetermined enable signal;

a pass transistor having a first terminal connected to an output of said gating means and having a gate connected to said power supply voltage; and a pull-down transistor having a gate connected to a second terminal of said pass transistor, having a first terminal connected to said word line boosted voltage, and having a second terminal connected to said capacitor.

4. The semiconductor memory device as claimed in claim 1, wherein:

said discharging means includes a transistor having a gate connected to said delay output signal.

5. The semiconductor memory device as claimed in claim 1, wherein:

said delay means comprises a plurality of inverters.

6. A word line loading compensating circuit of a semiconductor integrated circuit which compensates a word line boosted voltage changed in accordance with a word line loading, said word line loading compensating circuit comprising:

a memory cell array having a plurality of memory cells;

a word line boosting circuit for outputting said word line boosted voltage boosted over a power supply voltage so as to boost a voltage of a word line connected to said memory cell array;

a row decoder connected to said word line boosted voltage output from said word line boosting circuit for selecting said memory cell array in correspondence with a predetermined row address signal;

a capacitor for storing a charge from said word line boosted voltage;

variable connecting means for connecting said word line boosted voltage to said capacitor before said word line boosted voltage reaches a saturation level, and for cutting off said word line boosted voltage from said capacitor after said word line boosted voltage reaches said saturation level;

delay means, having said word line boosted voltage input thereto, for delaying said word line boosted voltage during an arrival time of said saturation level, and for generating a delay output signal which controls said variable connecting means; and discharging means, controlled by said delay output signal output from said delay means, for discharging said charge stored in said capacitor to ground after said word line boosted voltage reaches said saturation level.

7. The word line loading compensating circuit of a semiconductor memory device as claimed in claim 6, wherein:

said arrival time of said saturation level of said word line boosted voltage is approximately 10 nanoseconds to 20 nanoseconds.

8. The word line loading compensating circuit of a semiconductor memory device as claimed in claim 6, wherein said variable connecting means comprises:

NOR gating means for receiving said delay output signal output from said delay means and a predetermined enable signal;

an NMOS pass transistor having a first terminal connected to an output of said NOR gating means and having a gate connected to said power supply voltage; and an NMOS pull-down transistor having a gate connected to a second terminal of said NMOS pass transistor, having a first terminal connected to said word line boosted voltage, and having a second terminal connected to said capacitor.

9. The word line loading compensating circuit of a semiconductor memory device as claimed in claim 6, wherein:

said discharging means includes an NMOS transistor having a gate connected to said delay output signal.

10. The word line loading compensating circuit of a semiconductor memory device as claimed in claim 6, wherein:

said delay means comprises a plurality of inverters.

11. A word line loading compensating circuit which compensates a word line boosted voltage changed in accordance with a word line loading, said word line loading compensating circuit comprising:

a capacitor, having a first terminal constantly at ground potential, for storing a charge from said word line boosted voltage; and variable connecting means for connecting said word line boosted voltage to said capacitor before said word line boosted voltage reaches a saturation level, and for cutting off said word line boosted voltage from said capacitor after said word line boosted voltage reaches said saturation level.

12. The word line loading compensating circuit which compensates a word line boosted voltage changed in accordance with a word line loading, said word line loading compensating circuit comprising:

a capacitor for storing a charge from said word line boosted voltage;

variable connecting means for connecting said word line boosted voltage to said capacitor before said word line boosted voltage reaches a saturation level, and for cutting off said word line boosted voltage from said capacitor after said word line boosted voltage reaches said saturation level; and delay means, having said word line boosted voltage input thereto, for delaying said word line boosted voltage during an arrival time of said saturation level, and for generating a delay output signal which controls said variable connecting means.

13. The word line loading compensating circuit as claimed in claim 12, wherein said variable connecting means comprises:

gating means for receiving said delay output signal output from said delay means and a predetermined enable signal;

a pass transistor having a first terminal connected to an output of said gating means and having a gate connected to said power supply voltage; and a pull-down transistor having a gate connected to a second terminal of said pass transistor, having a first terminal connected to said word line boosted voltage, and having a second terminal connected to said capacitor.

14. The word line loading compensating circuit as claimed in claim 11, further comprising:

discharging means for discharging said charge stored in said capacitor to ground after said word line boosted voltage reaches said saturation level.

15. The word line loading compensating circuit as claimed in claim 12, further comprising:

discharging means for discharging said charge stored in said capacitor to ground after said word line boosted voltage reaches said saturation level.

* * * * *